United States Patent
Tillotson

(10) Patent No.: US 10,615,301 B1
(45) Date of Patent: Apr. 7, 2020

(54) DIFFUSING CONCENTRATOR FOR POWER-BEAM RECEIVER

(75) Inventor: Brian Tillotson, Kent, WA (US)

(73) Assignee: The Boeing Company, Chicago, IL (US)

(*) Notice: Subject to any disclaimer, the term of this patent is extended or adjusted under 35 U.S.C. 154(b) by 1562 days.

(21) Appl. No.: 12/430,962

(22) Filed: Apr. 28, 2009

(51) Int. Cl.
| | | |
|---|---|---|
| *H01L 31/054* | (2014.01) | |
| *H01L 31/05* | (2014.01) | |
| *H02S 40/22* | (2014.01) | |
| *F24S 23/30* | (2018.01) | |
| *F24S 23/79* | (2018.01) | |
| *H02S 20/23* | (2014.01) | |
| *B64G 1/44* | (2006.01) | |
| *H02S 10/40* | (2014.01) | |

(52) U.S. Cl.
CPC .......... *H01L 31/0547* (2014.12); *H01L 31/05* (2013.01); *H01L 31/0543* (2014.12); *H02S 40/22* (2014.12); *B64D 2211/00* (2013.01); *B64G 1/443* (2013.01); *F24S 23/30* (2018.05); *F24S 23/79* (2018.05); *H02S 10/40* (2014.12); *H02S 20/23* (2014.12)

(58) Field of Classification Search
CPC ......... H01L 31/02325; H01L 31/02327; H01L 31/0524; H01L 31/0525; H01L 31/02322; H01L 31/054; H01L 31/0549; H01L 31/0547; H01L 31/0543; H01L 31/055; H01L 31/0232; F24S 23/30; F24S 23/31; F24S 23/77; B64G 1/443
USPC .................. 136/290, 291, 293, 244–265, 292
See application file for complete search history.

(56) References Cited

U.S. PATENT DOCUMENTS

| | | | | |
|---|---|---|---|---|
| 3,018,313 A | * | 1/1962 | Gattone .............. | H01L 31/0543 136/246 |
| 3,162,766 A | * | 12/1964 | Ploke ............................. | 136/246 |
| 4,029,519 A | * | 6/1977 | Schertz ................. | H01L 31/052 136/246 |
| 4,131,485 A | * | 12/1978 | Meinel et al. ................. | 136/259 |
| 4,153,813 A | * | 5/1979 | Blieden ................. | H01L 31/055 136/247 |

(Continued)

FOREIGN PATENT DOCUMENTS

| | | | | | |
|---|---|---|---|---|---|
| TW | 318670 | * | 9/2007 | ............. | Y02E 10/46 |
| TW | 336414 | * | 7/2008 | ............. | F24S 23/30 |

OTHER PUBLICATIONS

Royal et al, "A Linear Concentrator with Uniform Flux", Feb. 2007, Proceedings of the 14th Sede Boquer Symposium on Solar Electricity Production, p. 79-82.*

(Continued)

*Primary Examiner* — Andrew J Golden
(74) *Attorney, Agent, or Firm* — Sage Patent Group

(57) ABSTRACT

A system and method for a diffusing concentrator for efficient extraction of power from a beam of light. The diffusing concentrator may include an optical concentrator, the optical concentrator configured to receive beams of light and focus them towards a defined area at a defined distance, and an optical diffuser, the optical diffuser configured to receive the focused beams of light and spread the focused beams of light substantially uniformly over the defined area. The diffusing concentrator may also include a reflective surface configured to reflect stray light from the diffusing concentrator toward the defined area such as a photovoltaic array.

20 Claims, 8 Drawing Sheets

(56) References Cited

U.S. PATENT DOCUMENTS

| | | | |
|---|---|---|---|
| 5,409,550 A * | 4/1995 | Safir | H01L 31/042 136/246 |
| 5,518,205 A * | 5/1996 | Wurst et al. | 136/291 |
| 5,590,495 A * | 1/1997 | Bressler et al. | 136/244 |
| 5,597,421 A * | 1/1997 | Regan et al. | 136/253 |
| 5,648,873 A * | 7/1997 | Jaster | F24J 2/062 359/591 |
| 6,689,949 B2 * | 2/2004 | Ortabasi | 136/246 |
| 2005/0081909 A1 * | 4/2005 | Paull | 136/246 |
| 2006/0048811 A1 * | 3/2006 | Krut et al. | 136/249 |
| 2006/0072222 A1 * | 4/2006 | Lichy | 359/853 |
| 2008/0017239 A1 | 1/2008 | Tillotson | |
| 2008/0087323 A1 * | 4/2008 | Araki et al. | 136/256 |
| 2008/0251112 A1 * | 10/2008 | Jenkins | H01L 31/0547 136/246 |
| 2008/0295883 A1 * | 12/2008 | Ducellier | H01L 31/0547 136/246 |
| 2008/0314436 A1 * | 12/2008 | O'Connell | H01L 31/02167 136/246 |
| 2009/0185302 A1 * | 7/2009 | Forrester | F24S 23/31 359/853 |
| 2009/0205699 A1 * | 8/2009 | Chang | H01L 31/0543 136/246 |

OTHER PUBLICATIONS

TW318670 English Machine translation (Year: 2007).*

Luxeon® Star LEDs, "Polymer Optics 25° X 6° Line Diffuser for the 181 Assembly.", http://www.luxeonstar.com/polymer-optics-25%C3%82%C2%B0-x-6%C3%82%C2%B0-1.

Edmund Optics, "Products in Diffusers," http://www.edmundoptics.com/onlinecatalog/browse.cfm?categoryid=453.

Newport, "Model: 10DKIT-C3: Circular Shaping Diffuser Kit, Wide, 25.4 Dia, 30°, 40°, 60°, 80°", http://search.newport.com/?q=*&sku=10DKIT-C3.

Thor Labs, "Optics: Engineered Diffusers™: Engineered Microlens Arrays Used to Diffuse and Shape Light" www.thorlabs.com.

* cited by examiner

DIFFUSING CONCENTRATOR FOR POWER-BEAM RECEIVER

BACKGROUND

The present invention is related to power beam receivers, and more specifically to diffusing concentrator for a power beam receiver.

Currently problems arise in transmitting power via beams of light because beams of light from artificial sources are not like sunlight. Sunlight has nearly uniform intensity over areas smaller than the Earth. Standard practice for arrays of photovoltaic cells (often called "solar cells") is to assume they will be used with uniform illumination. Hence, it is assumed that each cell produces the same power as its neighbors: cells are wired in series where each cell passes the same current and imparts the same voltage rise as its neighbors. With an artificial beam, this is not the case. Intensity of a beam varies across the beam width, often as a nominal Gaussian or Bessel function of radius from the beam center. The width of the beam may vary with distance from the source. In addition to the nominal variation, the beam pattern may have fine-grained variations induced by atmospheric turbulence. As a result, the beam that reaches a photovoltaic (PV) array may be highly non-uniform.

One cell, B, may receive substantially less light than another cell, A. In that case, cell B would produce substantially less current than A. (To a first approximation, a photovoltaic cell can be treated as a current generator whose output current is proportional to its illumination.) If A and B are wired in series, cell B blocks much of the current that cell A would normally produce. Therefore, even though cell A receives substantially more light than cell B, cell A's power output is reduced to barely more than B's. This reduces the overall efficiency of converting light to electricity. In an extreme case, one un-illuminated cell in a string can prevent all other cells in the string from producing power, i.e. efficiency is zero.

If one could predict exactly what beam pattern would occur, where it would be centered on the array, and what incidence angle it would have, then we could design an array where the size, efficiency, and orientation of each cell is selected so that all cells in a series string produce the same output current. In reality, however, the beam pattern may vary due to atmospheric irregularities and deformation of optical surfaces; its center location jitters due to imperfect tracking; and the angle of incidence varies as the receiving vehicle moves relative to the beam source. Furthermore, for a diffraction-limited beam, the beam width is roughly proportional to distance from the beam source, so the beam width will vary as the receiving vehicle moves closer to or farther from the beam source. If the beam width is wider than the PV array, then some of the beam's energy misses the array and is lost; if the beam width is narrower than the PV array, then some of the PV cells are not illuminated, causing problems as described above. Overall, then, the uneven, unpredictable illumination of a PV array by a power beam causes lost efficiency in several ways.

There are some current solutions for this particular problem, for example, wide, over-powered laser, local MPP controller, series-parallel trellis, and optical concentrator. However, each of these current solutions is problematic.

The wide, over-powered laser solution uses a greatly over-powered laser to illuminate the vehicle with a wide beam that is locally uniform and smooth over the width of the PV array. However, high-power lasers are costly: $10/watt is near the minimum cost, not including the cost of a highly regulated electrical power source, a reliable cooling system, beam-forming optics, and beam-steering optics and electronics. Even the energy supply for a laser can be costly, especially if the laser is used on a vehicle or in a remote location. Using a beam that is wide enough to project a near-uniform sub-pattern on the receiver wastes most of the laser's power. In addition, the user would have to pay for the whole high-power system. Besides the cost penalty, this solution does not fully solve the problem of non-uniform illumination. Atmospheric turbulence causes fleeting, small patches of brighter or dimmer illumination on the receiver, wasting energy due to mismatched output from PV cells in series.

The local MPP controller solution gives every cell a maximum power point (MPP) controller and DC-DC converter. An MPP controller continuously adjusts the cell's output load to maximize the cell's output power (current x voltage). The DC-DC converter transforms the voltage from each cell (which may vary as the cell's illumination varies) to match the common voltage at which all cells' current is collected in parallel. However, MPP controllers and DC-DC converters are not very efficient, especially at the low power levels produced by a single cell. Therefore, this solution wastes a substantial fraction of the beam power as heat. In addition, adding two electronic devices to each cell or small group of cells dramatically increases the weight and cost of a PV array.

The series-parallel trellis solution uses a complex series-parallel wiring scheme to reduce the effect of series-connection bottlenecks from under-illuminated cells. However, this solution requires many additional wires which add substantial weight to the PV array, and it is costly to design with current methods.

The optical concentrator solution uses an oversized optical concentrator to collect light from a wide beam and concentrate it on a modest-sized PV array. It may use reflecting or refracting optics. This solution mitigates the loss of energy from a beam that is substantially wider than the PV array. However, this solution (a) does not solve the problem of non-uniformity within the beam and (b) creates non-uniformity for beams smaller than the concentrator. For example, regarding (a), a wide, non-uniform beam is fully captured by the concentrator but its projection onto the PV array has the same pattern of non-uniformity as the original beam, just smaller. Also, regarding (b), a beam that is narrower than the concentrator is focused onto a subset of the PV array. Even if the beam were perfectly uniform, this focusing effect would leave part of the array dark.

In addition, there is a related problem of providing diffuse lighting in a small area for detailed manual work, such as dentistry or surgery. The current solution is a diffusing concentrator near the light source. A web search on the term "surgical lamp" will find many examples. Though the surgical lamp is an effective solution to the medical problem, it produces a beam that is too wide for high-intensity illumination at long range, and is, therefore, not an effective solution to the beamed power problem.

SUMMARY

According to one aspect of the present disclosure, a diffusing concentrator apparatus for efficient extraction of power from a beam of light includes an optical concentrator, the optical concentrator configured to receive beams of light and focus them towards a defined area at a defined distance, and an optical diffuser, the optical diffuser configured to receive the focused beams of light and spread the focused beams of light substantially uniformly over the defined area.

According to another aspect of the present disclosure, a mobile vehicle includes a photovoltaic array comprising an array of photovoltaic cells, a diffusing concentrator apparatus, the diffusing concentrator apparatus including: an optical concentrator, the optical concentrator configured to receive beams of light and focus them towards at least some of the photovoltaic cells, and an optical diffuser, the optical diffuser configured to receive the focused beams of light and spread the focused beams of light substantially uniformly over the at least some of the photovoltaic cells, and a propulsion system, the propulsion system receiving power from the photovoltaic array, the power being generated by the photovoltaic array based on the spread beams of light, the propulsion system when engaged causing movement of the mobile vehicle.

According to a still further aspect of the present disclosure, a method for an optical diffusing concentrator for efficient extraction of power from a beam of light includes determining a distance from the optical diffusing concentrator to a photovoltaic (PV) array, determining a physical layout of the PV array, determining an electrical connectivity within and among subsets of the PV array, and designing an optical diffusing concentrator, the optical diffusing concentrator being designed to minimize excessive diffusion, the optical diffusing concentrator being based on the distance from the optical diffusing concentrator to the PV array, the physical layout of the PV array, and the electrical connectivity within and among subsets of the PV array, wherein the optical diffusing concentrator comprises an optical concentrator configured to receive beams of light and focus them towards the PV array and an optical diffuser configured to receive the focused beams of light and spread the focused beams of light substantially uniformly over the PV array.

The features, functions, and advantages that have been discussed can be achieved independently in various embodiments of the present disclosure or may be combined in yet other embodiments further details of which can be seen with reference to the following description and drawings.

BRIEF DESCRIPTION OF THE DRAWINGS

The present disclosure is further described in the detailed description which follows in reference to the noted plurality of drawings by way of non-limiting examples of embodiments of the present disclosure in which like reference numerals represent similar parts throughout the several views of the drawings and wherein.

DETAILED DESCRIPTION

Figure 1:
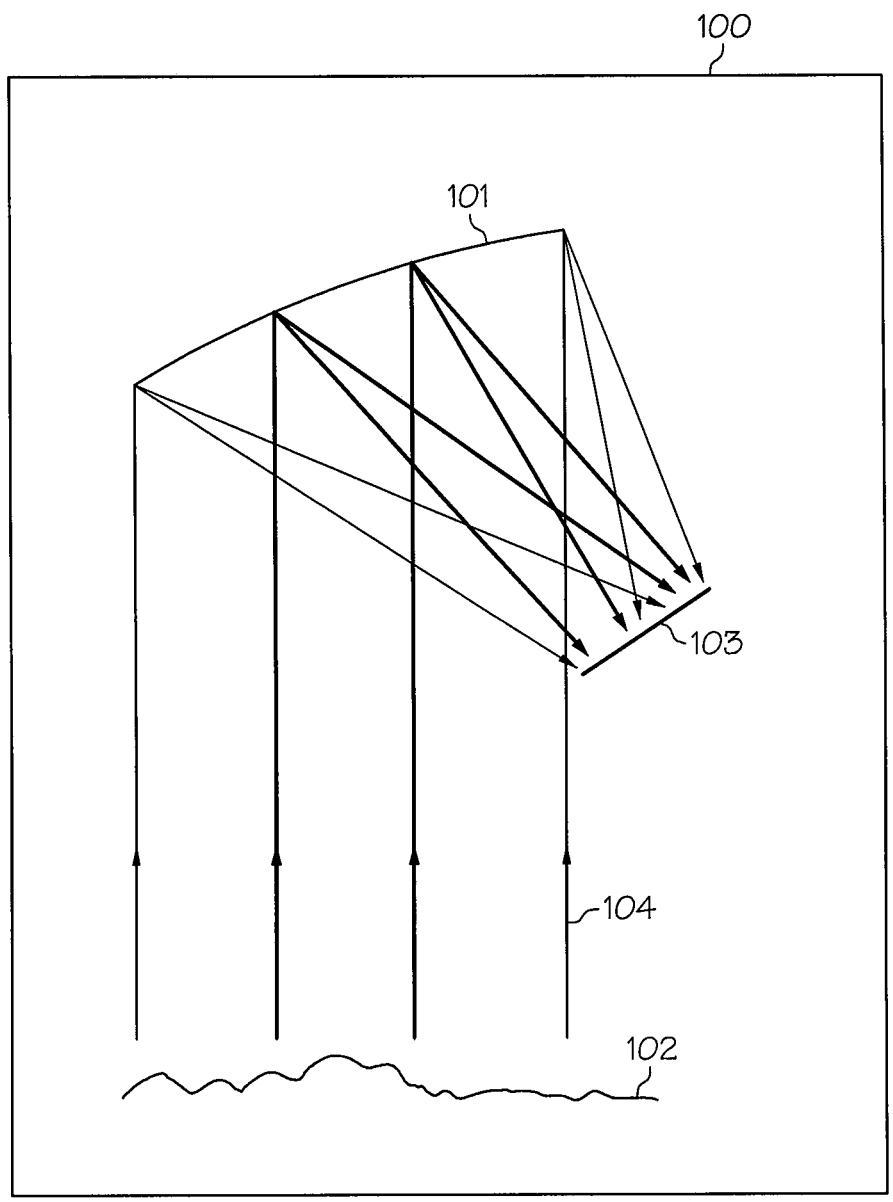
FIG. 1 is a diagram of a diffusing concentrator system according to an exemplary embodiment of the present disclosure.

The following detailed description of embodiments refers to the accompanying drawings, which illustrate specific embodiments of the disclosure. Other embodiments having different structures and operation do not depart from the scope of the present disclosure.

According to embodiments of the present disclosure, an optical diffuser is combined with an optical concentrator that directs light onto a PV array. The optical concentrator mitigates the problem of a wide beam wasting most of its energy by missing the PV array. The optical diffuser mitigates the problem of a narrow beam and the problem of non-uniformity in the beam by spreading small bright or dark patches over a large area of the array, thus illuminating the array more evenly. Embodiments according to the present disclosure may include reflective optical components and/or refractive optical components.

Embodiments according to the present disclosure provide solutions to problems related to the magnitude of the diffusing effect. For example, excessive diffusion causes a large fraction of the light to strike the PV array at an angle far from perpendicular, thus increasing reflection from the PV array and thereby wasting optical energy from the beam. This stronger diffusion also requires thicker and therefore heavier optics which is undesirable. Similarly, too little diffusion does not adequately smear the local bright and dark regions of the light beam resulting in a PV array that is electrically inefficient due to dark cells blocking current from well lit cells. Embodiments according to the present disclosure provide solutions to these problems related to excessive diffusion and too little diffusion by appropriately smearing the local bright and dark regions of the light beam so that the PV array is electrically efficient.

Moreover, embodiments according to the present disclosure provide solutions to problems related to the intensity gradient at the edge of the PV array. The illumination gradient at the PV array is a consequence of the diffusion. The diffusion spreads a collimated beam (such as light from a distant point source) into a broader angular pattern called the angular point spread function, PSF(θ). If the diffused beam from a small patch on a diffuser is projected onto a surface, such as a PV array, it yields a spacial point spread function, PSF(x). When an incident beam illuminates a broad section of the diffuser, the light projected onto the PV array is a combination of many local point spread functions. Their sum is a diffused beam with uniform intensity across its central region but with an intensity gradient at each edge. Embodiments according to the present disclosure provide solutions such that the gradient does not cause any non-uniform illumination at the PV array and thus avoids wasting energy. For example, embodiments according to the present disclosure may provide one or more straight reflective walls connecting each edge of the diffusing concentrator to the corresponding edge of the PV array. Thus, light that would normally escape past the edge of the PV array if no walls were present is reflected toward the PV array resulting in a more uniform illumination gradient at the PV array.

Embodiments according to the present disclosure provide a diffusing concentrator that may include an optical concentrator that receives beams of light and focuses them towards a defined area at a defined distance and an optical diffuser that receives the focused beams of light and spreads the focused beams of light substantially uniformly over a defined area, such as a PV array. The diffusing concentrator may comprise a self contained integrated optical concentrator and optical diffuser unit, or may comprise separate optical concentrator and optical diffuser components. The received beams of light may come from a light source, such as a laser light source, that has been configured to point at the optical concentrator portion of the diffusing concentrator even though the diffusing concentrator may reside on a moving structure or vehicle. Preferably, if a laser light source is used, it has a well characterized beam profile, and the atmospheric path through which the beam travels to the vehicle or apparatus housing the diffusing concentrator has well characterized values (at least in a statistical sense) for distance, thermal blooming, scattering and turbulence. Embodiments according to the present disclosure may be optimized for a particular application when these values are known.

The optical concentrator and the optical diffuser may each comprise reflective optical components or refractive optical components. The optical diffuser may be coated to efficiently reflect (or transmit if a refractor) light at the laser's wavelength. According to embodiments of the present disclosure, the angular PSF and the distance from the PV array may be chosen to produce a spacial PSF that exceeds the size of series-connected subsets of the PV array. Therefore, the PSF may cover any one subset of the PV array fairly uniformly even when the beam is not centered on one subset. According to embodiments of the present disclosure, the bigger spacial PSF may be achieved by choosing an optical diffuser with greater angular PSF, by mounting the optical diffuser and the PV array with more distance between them, or a combination of both.

FIG. 1 shows a diagram of a diffusing concentrator system according to an exemplary embodiment of the present disclosure. In the system 100, a diffusing concentrator 101 may receive beams of light 104 generated by a light source that produces an uneven intensity pattern 102 of beams and focus the beams of light 104 substantially uniformly over a defined area such as a PV array 103. The thickness of the lines illustrating the beams of light 104 represent an intensity level of each beam. The intensity pattern 102 represents where the beams are stronger (i.e., more intense) or less intense, as spread over a defined distance. As shown in FIG. 1, the diffusing concentrator focuses the light beams 104 and spreads the focused beams of light substantially uniformly over the PV array 103.

Figure 2:
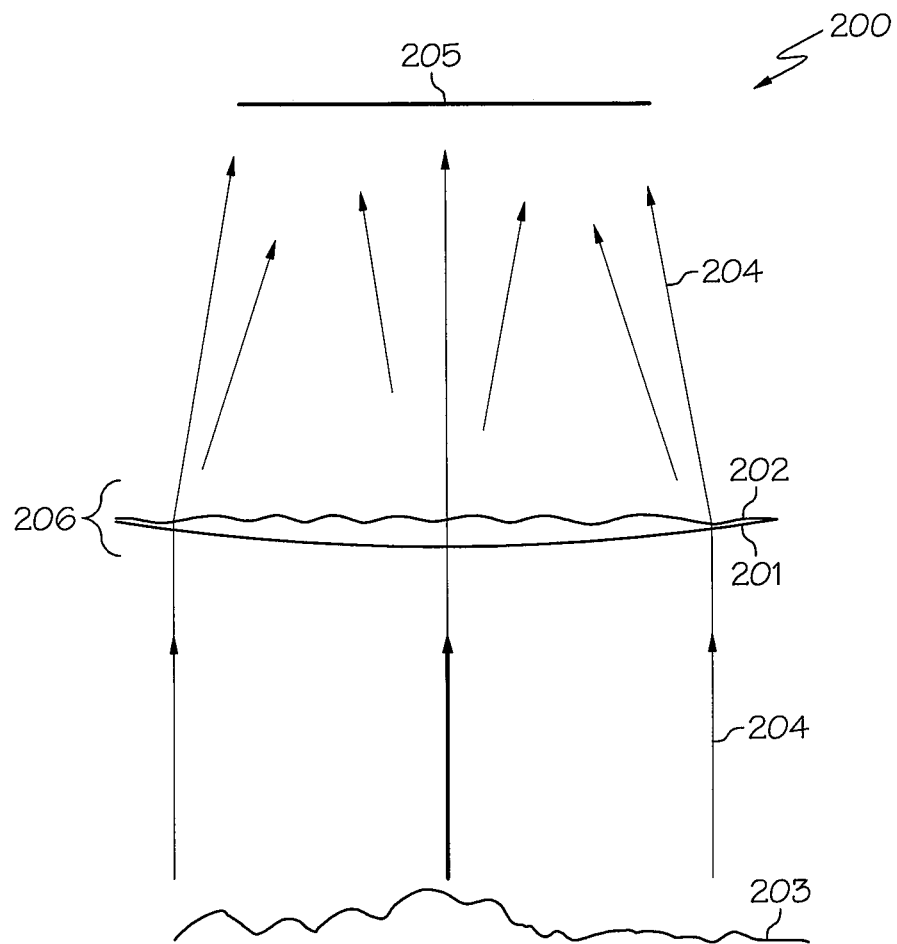
FIG. 2 is a system for a diffusing concentrator with refractive optical components according to an exemplary embodiment of the present disclosure.

FIG. 2 shows a system for a diffusing concentrator with refractive optical components according to an exemplary embodiment of the present disclosure. In the system 200, a diffusing concentrator 206 may consist of an optical concentrator 201 and an optical diffuser 202. The optical concentrator 201 and the optical diffuser 202 are composed of refractive optics. The diffusing concentrator 206 may receive an uneven intensity pattern of light 203 where the beams 204 may be at various intensity levels. The diffusing concentrator 206 focuses the beams 204 onto a defined area such as a PV array 205 in a substantially uniform manner. This enhances the efficiency of the PV array.

Figure 3:
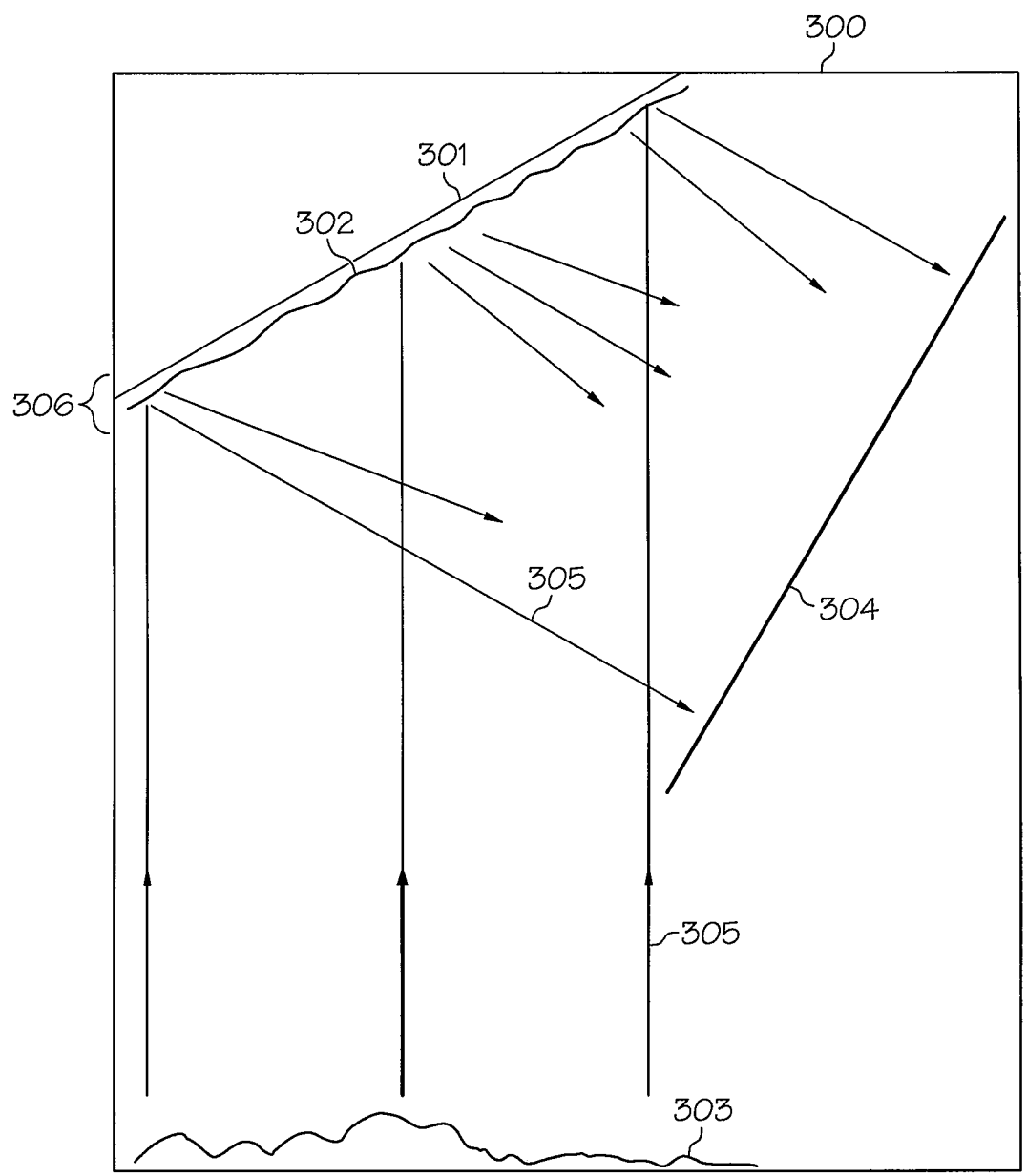
FIG. 3 is a system for a diffusing concentrator with reflective optical components according to an exemplary embodiment of the present disclosure.

FIG. 3 shows a system for a diffusing concentrator with reflective optical components according to an exemplary embodiment of the present disclosure. In this embodiment, a diffusing concentrator 306 may include an optical concentrator 301 and an optical diffuser 302 where the optical concentrator and the optical diffuser comprise reflective optical components. The diffusing concentrator 306 may reflect received beams of light 305 with an uneven intensity pattern 303 onto a defined area such as a PV array 304. The light beams are focused onto the PV array 304 in a substantially uniform manner enhancing the efficiency of the PV array.

Figure 4:
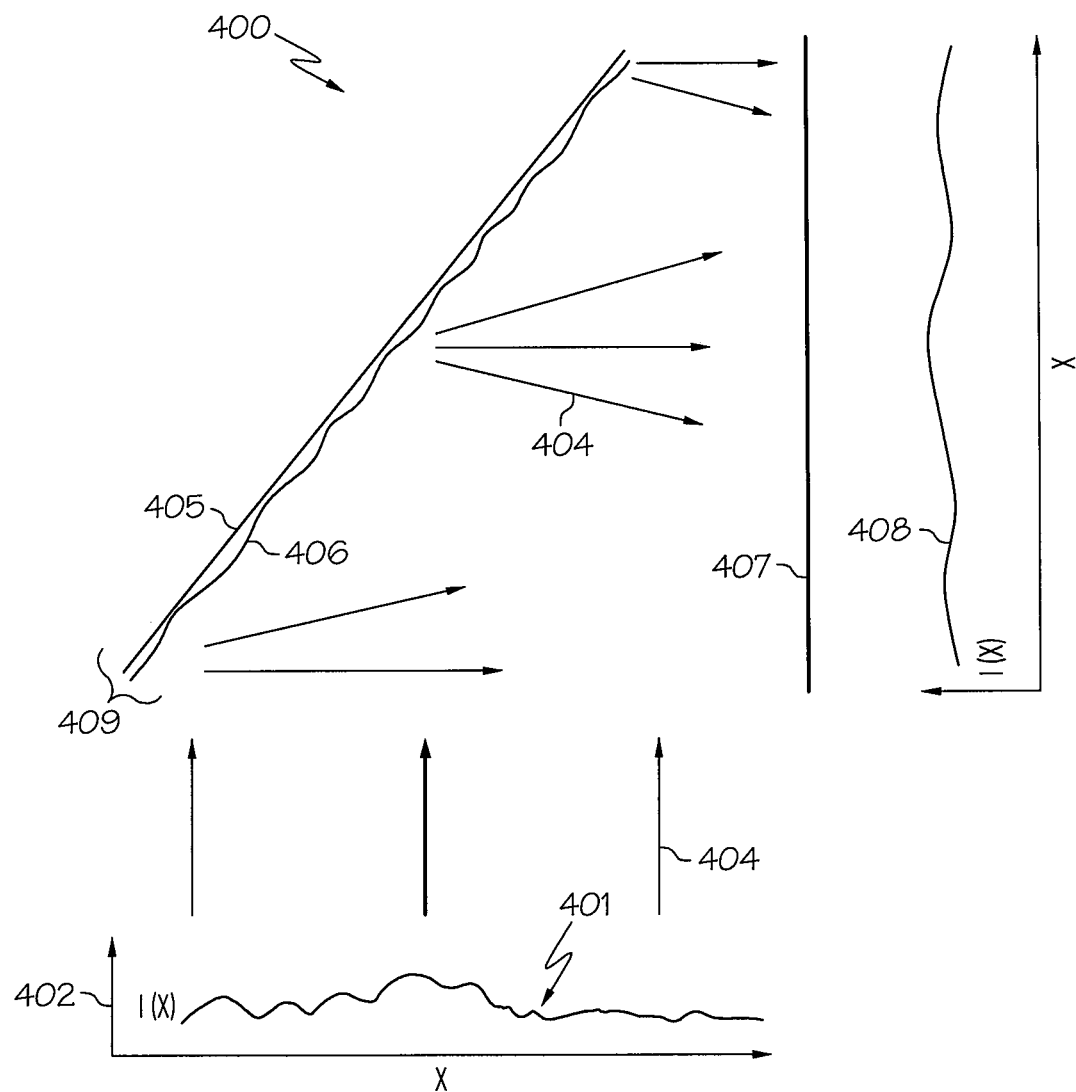
FIG. 4 is a system for a diffusing concentrator using reflective optical components illustrating uniform intensity of beams received at a PV array according to an exemplary embodiment of the present disclosure.

FIG. 4 shows a system for a diffusing concentrator using reflective optical components illustrating uniform intensity of beams received at a PV array according to an exemplary embodiment of the present disclosure. In the system 400, a diffusing concentrator 409 may include an optical concentrator 405 and an optical diffuser 406. The diffusing concentrator 409 may receive light beams 404 from a light source that generates an uneven intensity pattern 401 of light where the light beams 404 have various intensities 402. The diffusing concentrator 409 may focus the beams 404 onto a PV array 407. The illumination graph 408 shows the intensity or magnitude of the diffusing effect over the PV array 407 and illustrates how embodiments according to the present disclosure provide a substantially uniform illumination pattern at the PV array 407. Therefore, the electrical efficiency of PV array 407 is increased due to adequate smearing of the light beams by the diffusing concentrator 409. Further, optical energy from the light beams is not wasted.

Figure 5:
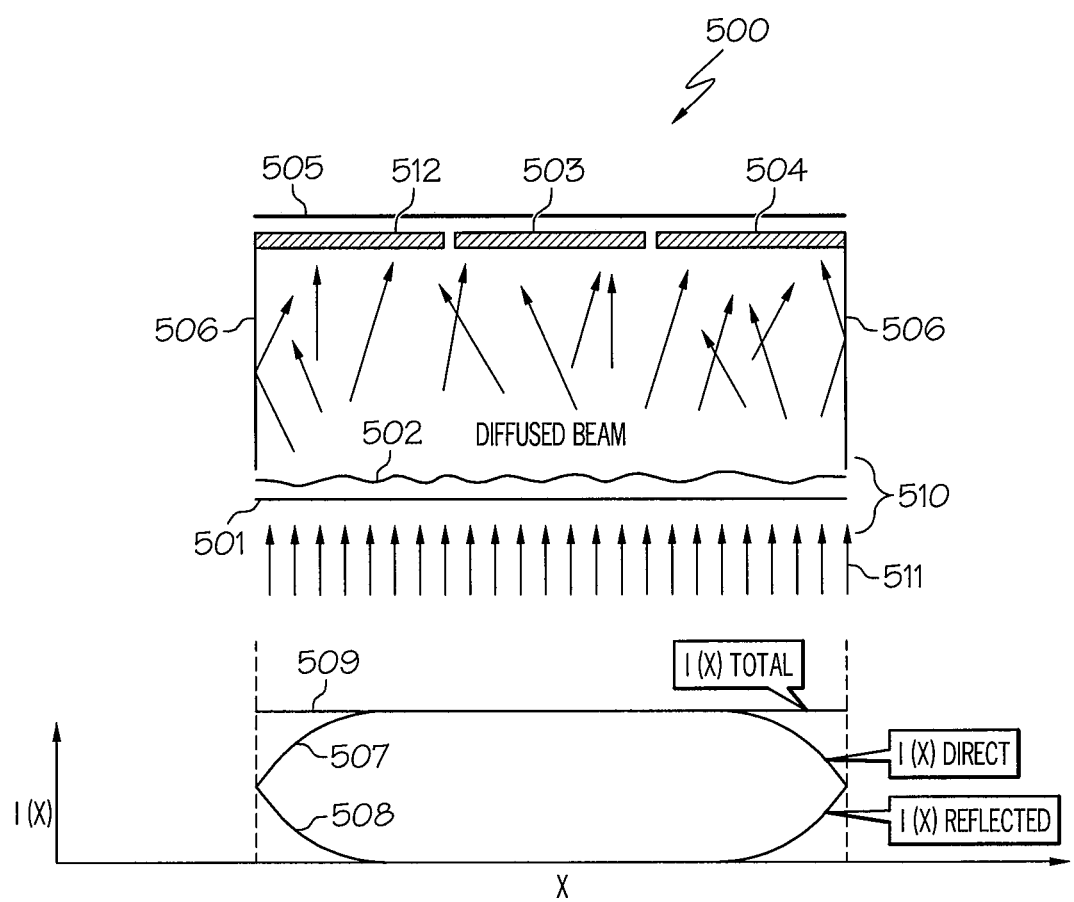
FIG. 5 is a system illustrating a diffusing concentrator system according to another exemplary embodiment of the present disclosure.

FIG. 5 shows a system illustrating a diffusing concentrator system according to another exemplary embodiment of the present disclosure. In this exemplary embodiment, the system 500 may include a diffusing concentrator 510 that may comprise an optical concentrator 501 and an optical diffuser 502. The system may also include one or more reflective surfaces or walls 506. The diffusing concentrator 510 may receive incoming beams of light 511 and focus these beams in a substantially uniform manner over various cells 503, 504, 512 of a PV array 505. The reflective walls 506 focus light beams, which would otherwise escape past edges of the PV array 505, back towards the PV array 505. Therefore, the resulting intensity pattern at the PV array 509 is substantially uniform and takes into effect a sum of the intensity pattern 507 from the beams received at the PV array 505 from the diffusing concentrator 510 as well as from the intensity pattern 508 of beams that have been reflected towards the PV array 505 from the reflective walls 506.

Figure 6:
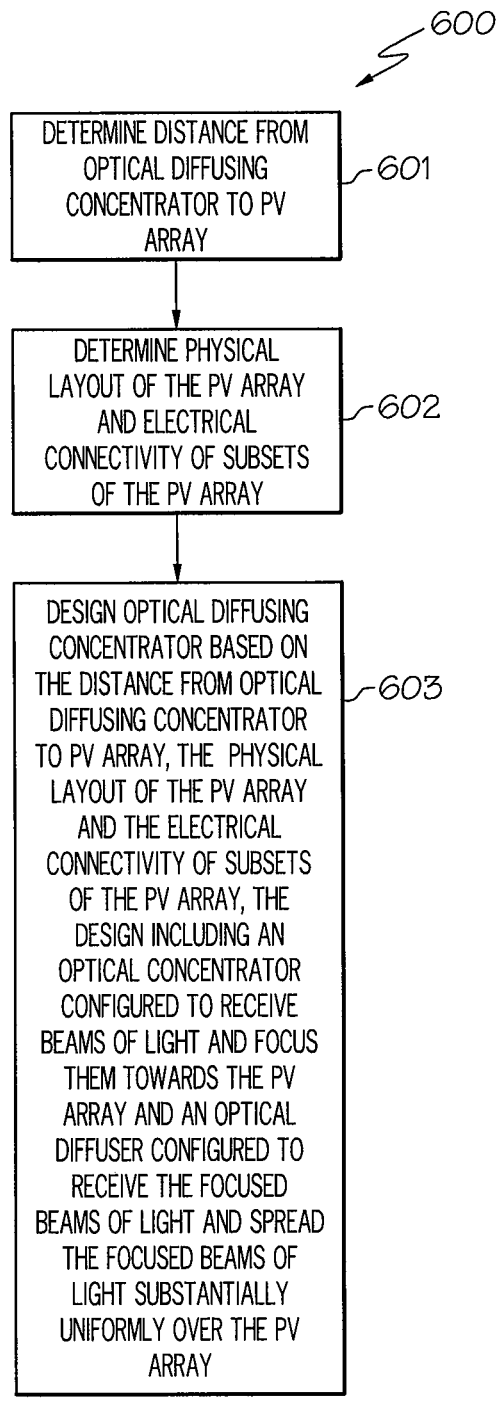
FIG. 6 is a flowchart of a process for an optical diffusing concentrator according to an exemplary embodiment of the present disclosure.

FIG. 6 shows a flowchart of a process for an optical diffusing concentrator according to an exemplary embodiment of the present disclosure. In the process 600, in block 601, a distance from an optical diffusing concentrator to a PV array may be determined. In block 602, a physical layout of the PV array and electrical connectivity of subsets of cells of the PV array may be determined. In block 603, an optical diffusing concentrator may be designed based on the distance from the optical diffusing concentrator to the PV array, the physical layout of the PV array and the electrical connectivity of subsets of cells of the PV array. The design includes an optical concentrator configured to receive beams of light and focus them toward the PV array and an optical diffuser configured to receive the focused beams of light and spread the focused beams of light substantially uniformly over the PV array. An optical diffusing concentrator may be designed for specific applications by varying and taking into consideration the above criteria.

Figure 7:
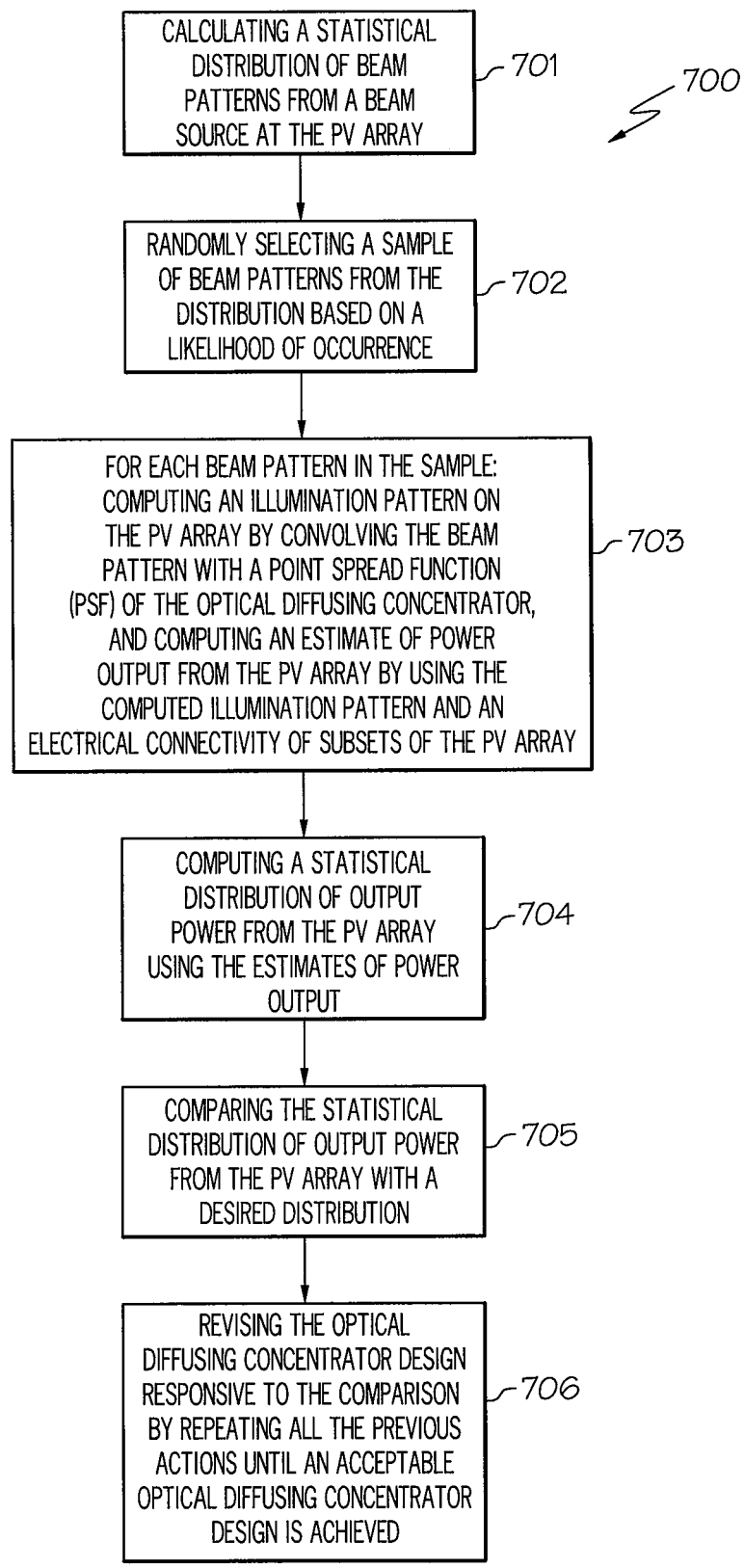
FIG. 7 is a flowchart of a process for an optical diffusing concentrator according to another exemplary embodiment of the present disclosure.

FIG. 7 shows a flowchart of a process for an optical diffusing concentrator according to another exemplary embodiment of the present disclosure. In the process 700, in block 701, a statistical distribution of beam patterns from a beam source at the PV array may be calculated. In block 702, a sample of beam patterns from the distribution may be randomly selected based on a likelihood of occurrence. For example, a Monte Carlo analysis may be performed. In block 703, for each beam pattern in the sample: an illumination pattern on the PV array may be computed by convolving the beam pattern with a point spread function of the optical diffusing concentrator, and computing an estimate of power output from the PV array by using the computed illumination pattern and an electrical connectivity of subsets of the PV array. In block 704, a statistical distribution of output power from the PV array may be computed using the estimates of power output. In block 705, the statistical distribution of output power from the PV array may be compared with a desired distribution. In block 706, the optical diffusing concentrator design may be revised responsive to the comparison by repeating all the above previous actions until an acceptable optical diffusing concentrator design is achieved. An acceptable optical diffusing concentrator design may be based on a desired use of the optical diffusing concentrator for a specific application.

Figure 8:
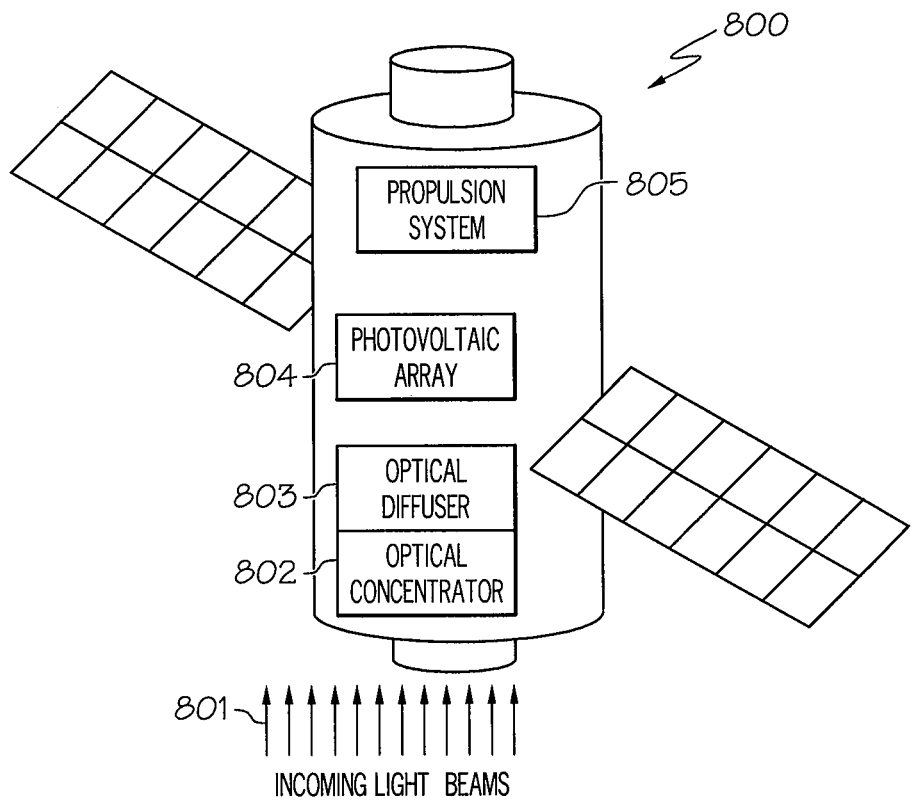
FIG. 8 is a diagram of an airborne mobile vehicle containing an optical diffusing concentrator according to an exemplary embodiment of the present disclosure.

FIG. 8 shows a diagram of an airborne mobile vehicle containing an optical diffusing concentrator according to an exemplary embodiment of the present disclosure. In this embodiment, the airborne vehicle 800 comprises a satellite. The satellite 800 may include an optical concentrator 802 and an optical diffuser 803 where these make up an optical diffusing concentrator. The satellite 800 may also include a photovoltaic array 804 and a propulsion system 805. The optical concentrator 802 of the optical diffusing concentrator may receive incoming light beams 801 and focus these light beams on the PV array 804. The optical diffuser 803 of the optical diffusing concentrator may receive the focused light beams from the optical concentrator 802 and substantially uniformly spread these light beams over the PV array 804. The PV array 804 may then generate power from the light beams that may be applied to the propulsion system 805 that provides movement to the satellite 800. Although a satellite is shown in this embodiment illustrating an airborne vehicle, embodiments according to the present disclosure are not limited to a satellite as any type of airborne vehicle is within the scope of the present disclosure. For example, airborne vehicles such as an airplane, a space station, a space craft, a blimp, etc. containing an optical diffusing concentrator are within the scope of the present disclosure.

Figure 9:
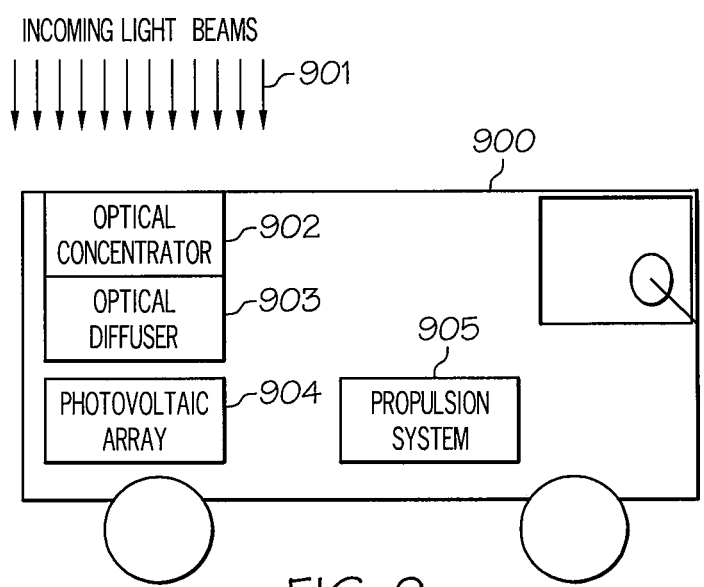
FIG. 9 is a diagram of a land-based mobile vehicle containing an optical diffusing concentrator according to an exemplary embodiment of the present disclosure.

FIG. 9 shows a diagram of a land-based mobile vehicle containing an optical diffusing concentrator according to an exemplary embodiment of the present disclosure. In this exemplary embodiment, the land-based vehicle 900 comprises a truck where the land-based vehicle 900 may include an optical concentrator 902 and an optical diffuser 903 that make up an optical diffusing concentrator. The truck 900 may also include a photovoltaic array 904 and a propulsion system 905. The optical concentrator 902 may receive incoming light beams 901 from a light source and direct these light beams to the photovoltaic array 904. The optical diffuser 903 may receive the focused light beams from the optical concentrator 902 and spread the focused beams of light substantially uniformly over the photovoltaic array 904. The photovoltaic array 904 may receive these light beams and generate power from these light beams for the propulsion system 905 that provides movement of the truck 900. Although a truck is shown in this exemplary embodiment illustrating a land-based vehicle, embodiments according to the present disclosure are not limited to a truck as any type of land-based vehicle or surface watercraft is within the scope of the present disclosure. Likewise, although exemplary embodiments described herein have used light to illuminate a photovoltaic array, embodiments according to the present disclosure may encompass infrared, visible, and/or ultraviolet radiation to illuminate a photovoltaic array.

Although embodiments are illustrated using a land-based mobile vehicle, embodiments of the present disclosure are not limited to a land-based mobile vehicle but also include land-based stationary structures or apparatus. In this regard, stationary embodiments according to the present disclosure may be used to receive power from a beam for a stationary application. For example, power may be transmitted via a laser beam to a stationary receiver on the ground. The stationary receiver may include an optical diffusing concentrator according to the present disclosure that receives the laser beam. The optical diffusing concentrator may then provide power to be used by the stationary structure/apparatus in any of many various ways, for example, to charge batteries, to power local equipment, to provide power for a regional electric grid, etc.

Embodiments according to the present disclosure improve the optical-to-electric conversion efficiency of a beam powered system, and do so with less weight and less cost than other solutions. Typical efficiency with other solutions might be in the range from 50% to 75%, while efficiency in systems and apparatus according to embodiments of the present disclosure may be above 90%.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

The invention claimed is:

1. A diffusing concentrator apparatus for efficient extraction of power from a beam of light, comprising:
   an optical concentrator, the optical concentrator configured to receive beams of light and focus them towards a defined area at a defined distance, the defined area comprising a plurality of edges;
   an optical diffuser, the optical diffuser configured to receive the focused beams of light and spread the focused beams of light substantially uniformly over the defined area, wherein the optical concentrator and the optical diffuser coextend adjacent one another, the optical diffuser comprising a plurality of edges and the optical diffuser and the optical concentrator each comprise a substantially planar structure and coextend parallel to one another, the optical concentrator comprising a planar surface that receives the beams of light; and
   a plurality of straight reflective walls to reflect stray light from the diffusing concentrator apparatus toward only the defined area, wherein the straight reflective walls extend parallel with each other and respectively connect each edge of the optical diffuser to a corresponding edge of the defined area preventing loss of light energy, the defined distance providing an open space between the optical diffuser and the defined area and within the plurality of straight reflective walls and the defined area corresponds to only a plane at an opposite end of the open space from the optical diffuser, wherein the defined area comprises an array of photovoltaic cells, a side of at least some photovoltaic cells of the array of photovoltaic cells abut an interior surface of the plurality of straight reflective walls.

2. The apparatus according to claim 1, wherein the beams of light comprise non-uniform beams of light, wherein the beams of light are generated by a laser light source, the laser light source being configured to point the beams of light at the optical concentrator.

3. The apparatus according to claim 1, wherein the optical concentrator and the optical diffuser each comprise refractive optical components and no reflective optics.

4. A mobile vehicle comprising:
a photovoltaic array comprising an array of photovoltaic cells, the photovoltaic array comprising a plurality of edges;
a diffusing concentrator apparatus, the diffusing concentrator apparatus comprising:
a single optical concentrator, the optical concentrator configured to receive beams of light directly from a light source and focus them towards at least some of the photovoltaic cells at a defined distance; and
an optical diffuser, the optical diffuser configured to receive the focused beams of light and spread the focused beams of light substantially uniformly over the at least some of the photovoltaic cells, wherein the optical concentrator and the optical diffuser each comprise a substantially planar structure and coextend parallel to one another; and
a plurality of straight reflective walls to reflect stray light from the diffusing concentrator apparatus toward only the photovoltaic array, wherein the straight reflective walls extend parallel with each other and respectively connect each edge of the diffusing concentrator apparatus to a corresponding edge of the photovoltaic array preventing loss of light energy, the defined distance providing an open space between the optical diffuser and the photovoltaic array and within the plurality of straight reflective walls and the photovoltaic array defining only a plane at an opposite end of the open space from the diffusing concentrator apparatus, the photovoltaic array comprising an array of photovoltaic cells, a side of at least some photovoltaic cells of the photovoltaic array abut an interior surface of the plurality of straight reflective walls; and
a propulsion system, the propulsion system receiving power from the photovoltaic array, the power being generated by the photovoltaic array based on the spread beams of light, the propulsion system when engaged causing movement of the mobile vehicle.

5. The mobile vehicle according to claim 4, wherein the mobile vehicle comprises one of a car, a boat, a satellite, an airplane, a space station, a land vehicle, an airborne vehicle, a spacecraft or a blimp.

6. A beam-powered system comprising:
a concentrating optical diffuser comprising a plurality of edges; and
a photovoltaic array comprising photovoltaic cells at a defined distance from the concentrating optical diffuser, the photovoltaic array comprising a plurality of edges, wherein the concentrating optical diffuser is configured to spread incident light received directly from a remote beam source substantially uniformly over at least one subset of the photovoltaic cells, wherein the concentrating optical diffuser comprises an optical concentrator and an optical diffuser, the optical concentrator and the optical diffuser each comprise a substantially planar structure and coextend parallel to one another, and a plurality of straight reflective walls to reflect stray light from the concentrating optical diffuser toward only the photovoltaic array, wherein the straight reflective walls extend parallel with each other and respectively connect each edge of the concentrating optical diffuser to a corresponding edge of the photovoltaic array preventing loss of light energy, the defined distance providing an open space between the concentrating optical diffuser and the photovoltaic array and the photovoltaic array defining only a plane at an opposite end of the open space from the concentrating optical diffuser, a side of at least some photovoltaic cells of the photovoltaic array abut an interior surface of the plurality of straight reflective walls.

7. The system according to claim 6 wherein the concentrating optical diffuser has refractive optics.

8. The system according to claim 6, wherein the beam-powered system resides in a vehicle.

9. The system according to claim 8, wherein the beam-powered system resides in one of an airborne vehicle or a ground-based vehicle, the beam-powered system providing power to the airborne vehicle or the ground-based vehicle.

10. The system of claim 6, wherein the beam-powered system resides in a stationary structure.

11. The system of claim 10 wherein the beam powered system provides power to the stationary structure for at least one of to charge batteries, to power local equipment, or to provide power for a regional electric grid.

12. The system of claim 6, wherein at least one subset of the photovoltaic cells is connected in series.

13. The apparatus according to claim 1, wherein the optical concentrator and the optical diffuser are designed by comparing a statistical distribution of output power from a photovoltaic array with a desired distribution of the output power and revising at least one of the optical concentrator and the optical diffuser in response to the comparison to provide the desired distribution of the output power.

14. The apparatus of claim 1, wherein the optical diffuser comprises a refractive component and is at a chosen distance from the defined area that cause a light beam entering the diffusing concentrator apparatus to cover the defined area uniformly when the light beam entering the diffusing concentrator apparatus is not centered on the defined area.

15. The apparatus of claim 1, wherein the optical diffuser comprises a refractive component that provides an angular point spread function, the angular point spread function and a distance of the optical concentrator and optical diffuser from the defined area are chosen to produce a spatial point spread function that causes a light beam entering the diffusing concentrator apparatus to cover the defined area uniformly when the light beam entering the diffusing concentrator apparatus is not centered on the defined area.

16. The apparatus of claim 1, wherein the optical diffuser comprises a refractive component that provides an angular point spread function, the angular point spread function and a distance of the optical concentrator and optical diffuser from the array of photovoltaic cells are chosen to produce a spatial point spread function that exceeds a size of a series-connected subset of the array of photovoltaic cells, the spatial point spread function causing a light beam entering the diffusing concentrator apparatus to cover the series connected subset uniformly when the light beam entering the diffusing concentrator apparatus is not centered on the series-connected subset.

17. The diffusing concentrator apparatus of claim 1, wherein the diffusing concentrator apparatus resides on a vehicle and the defined area comprises an array of photo voltaic cells that provide electrical power to the vehicle.

18. The diffusing concentrator apparatus of claim 17, wherein the vehicle comprises one of an airborne vehicle, spacecraft, ground-based vehicle, or watercraft.

19. The diffusing concentrator apparatus of claim 17, wherein the electrical power is supplied to a propulsion system of the vehicle.

20. The diffusing concentrator apparatus of claim 1, wherein the diffusing concentrator apparatus resides in a stationary structure and provides power to the stationary structure.

* * * * *